Jan. 29, 1963 F. ROZNER 3,076,150

TRANSISTOR CIRCUITS

Filed May 20, 1958 2 Sheets-Sheet 1

INVENTOR
FELIX ROZNER

BY

Norman J. O'Malley
ATTORNEY

Jan. 29, 1963 F. ROZNER 3,076,150

TRANSISTOR CIRCUITS

Filed May 20, 1958 2 Sheets-Sheet 2

INVENTOR
FELIX ROZNER
BY
Norman J. O'Malley
ATTORNEY

United States Patent Office 3,076,150
Patented Jan. 29, 1963

3,076,150
TRANSISTOR CIRCUITS

Felix Rozner, London, England, assignor to Ferguson Radio Corporation, London, England, a British company Filed May 20, 1958, Ser. No. 736,482
1 Claim. (Cl. 330—11)

The present invention relates to transistor circuits.

There are many circuits which are required to handle signals at specific D.C. levels. If there is a D.C. path between the input and output terminals of the circuit a D.C. level can usually be retained. In many cases, however, it is desirable to employ A.C. couplings in the circuit and this necessitates the use of additional components whose function is to restore the D.C. level.

According to a first aspect of the present invention, there is provided a D.C. restoring circuit comprising a transistor having a base electrode, a collector electrode and an emitter electrode, an input circuit connected to the base electrode and to which in operation signals to be restored to a predetermined D.C. level are applied, an output circuit connected to the emitter electrode, and means so biasing the base-collector junction of the transistor that said junction is reverse biased for input signal excursions to one side of said predetermined D.C. level and is forward biased for signal excursions to the other side of said level. Signal excursions are thus restored to said D.C. level and signals appear in the output circuit as D.C. restored signals.

In an embodiment according to the said first aspect of the invention, the output circuit is connected to one electrode of a two or more electrode semi-conducting device, the junction formed by said electrode and another of said electrodes being reverse biased for output signal excursions to one side of a further predetermined D.C. level and forward biased for output signal excursions to the other side of the further predetermined level, whereby output signal excursions are limited to excursions between said predetermined D.C. level and said further predetermined D.C. level.

Preferably, said semi-conducting device is a further transistor having a base electrode, a collector electrode and an emitter electrode, and said output circuit is connected to the emitter electrode of the further transistor, the base-emitter junction of which is reverse biased for output signal excursions to one side of said further predetermined D.C. level and is forward biased for output signal excursions to the other side of the further predetermined D.C. level.

According to a second aspect of the present invention, there is provided a D.C. restorer circuit comprising a transistor having a base electrode, a collector electrode and an emitter electrode, an input circuit to which in operation signals to be restored to a predetermined D.C. level are applied, an output circuit connected to the input circuit and to the emitter electrode, the base-emitter junction of the transistor being so biased that said junction is reverse biased for output signal excursions to one side of said predetermined D.C. level and is forward biased for output signal excursions to the other side of said predetermined D.C. level. Signal excursions are thus limited to the predetermined level and signals appear in the output circuit as D.C. restored signals.

In a preferred embodiment, there is provided in combination a D.C. restorer circuit according to the first aspect of the invention and a D.C. restorer circuit according to the second aspect of the invention, the two circuits having a common output circuit.

Some embodiments of the invention will now be described by way of example with reference to the accompanying drawings in which.

Figure 1:
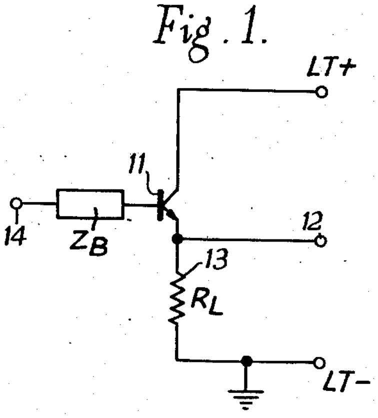
FIG. 1 is a circuit diagram of a common collector transistor circuit.

Referring first to FIG. 1, this shows a common collector transistor circuit embodying an NPN transistor 11, the emitter of which is connected to an output terminal 12 and through a load resistor 13 of resistance $R_L$ to earth. The base of the transistor is connected through an input circuit, the total impedance of which is represented by the impedance $Z_B$, to an input terminal. The collector is connected to the positive terminal LT+ of a bias source (not shown), the negative terminal LT— of said source being connected to earth.

Following the generally accepted theory for transistor circuits the output impedance $Z_{01}$ can be represented approximately as follows:

$$Z_{01}=\frac{Z_B\left(1-\alpha_0+j\frac{\omega}{\omega_0}\right)}{1+j\frac{\omega}{\omega_0}}$$

where:

$Z_B$ is the total impedance in the base arm,
$\alpha_0$ is the emitter to collector current gain at low frequencies,
$\omega_0/2\pi$ is the current gain cut off frequency, and
$\omega$ is the operating frequency.

Since for most modern transistors $\alpha_0$ is about 0.98 there is little difficulty in obtaining a value of $Z_{01}$ of the order of 100 ohms or less. On the other hand, when the transistor is cut off, that is to say, when the base-emitter junction is reverse biased the output impedance increases to a value within an order of magnitude of 1M ohm.

Figure 2:
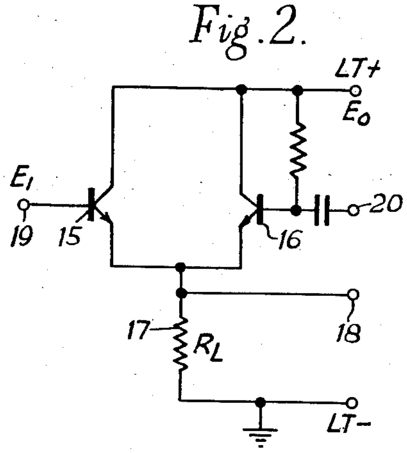
FIGS. 2 to 5 are circuit diagrams of different embodiments of the invention.

Referring now to FIG. 2, this shows a circuit comprising two NPN transistors 15 and 16, the emitters of which are connected to earth through a common load resistor 17 of resistance $R_L$ and to an output terminal 18. The base of the transistor 15 is connected to an input terminal 19, which is in operation maintained at a predetermined D.C. potential $E_1$. The base of the other transistor 16 is coupled to an input terminal 20, to which in operation an input signal is applied. The collectors of the two transistors are maintained at a potential $E_0$ by connection to the positive terminal LT+ of a D.C. bias source (not shown), the negative terminal LT— of said source being connected to earth.

In operation, signals applied to the input terminal 20 are amplified by the transistor 16 and amplified signals appear at the output terminal 18.

Provided the output signal potential does not fall below $E_1$ the base-emitter junction of the transistor 15 is reverse biased and the transistor 15 cut off. In these circumstances the output impedance of the transistor 15 is high and the transistor 15 has very little shunting effect upon the load resistor 17 and the transistor 16. The transistor 16 thus functions as a common collector amplifier.

When the signals applied to the input terminal 20 fall to zero, the output signal potential falls to the value $E_1$. At this value, the base-emitter junction of the transistor 15 becomes forward biased and the transistor 15 conducts to maintain the output signal potential at the value $E_1$. The output signal is thus D.C. restored to a potential $E_1$.

It the input signal applied to the input terminal 20 is a rapidly changing signal, a delay will be observed in the clamping action of the transistor 15. This delay appears as a slight overshoot in the case of a pulsed input signal. Such overshoot can, however, be avoided by arranging that the values of the circuit components satisfy a given condition, which can be derived as follows by considering the expression for the output impedance $Z_{01}$ of the transistor 15.

If $Z_B$, the total impedance of the base arm of the transistor 15, is assumed to be of the form $$R+\frac{1}{j\omega C}$$

then $$Z_{01}=\frac{\left(R+\frac{1}{j\omega C}\right)\left\{(1-\alpha_0)+j\frac{\omega}{\omega_0}\right\}}{1+j\frac{\omega}{\omega_0}}$$

$$=\frac{(1+j\omega RC)\left(1-j\frac{\omega}{\omega_0}\right)\left\{(1-\alpha_0)+j\frac{\omega}{\omega_0}\right\}}{j\omega C\left\{1+\left(\frac{\omega}{\omega_0}\right)^2\right\}}$$

$$=\omega\frac{\left\{(1-\alpha_0)\left(RC-\frac{1}{\omega_0}\right)+\left(1+\frac{\omega^2RC}{\omega_0}\right)\frac{1}{\omega_0}\right\}+j\left\{\frac{\omega^2}{\omega_0}\left(RC-\frac{1}{\omega_0}\right)-(1-\alpha_0)\left(1+\frac{\omega^2RC}{\omega_0}\right)\right\}}{\omega C\left\{1+\left(\frac{\omega}{\omega_0}\right)^2\right\}}$$

The reactive component of $Z_{01}$ is inductive when the imaginary part of the above expression is positive, that is to say, if $$\frac{\omega^2}{\omega_0}\left(RC-\frac{1}{\omega_0}\right)>(1-\alpha_0)\left(1+\frac{\omega^2RC}{\omega_0}\right)$$

or $$RC>\frac{1}{\omega_0}$$

By suitable choice of circuit components this condition can be reversed and any overshoot substantially eliminated.

Figure 3:
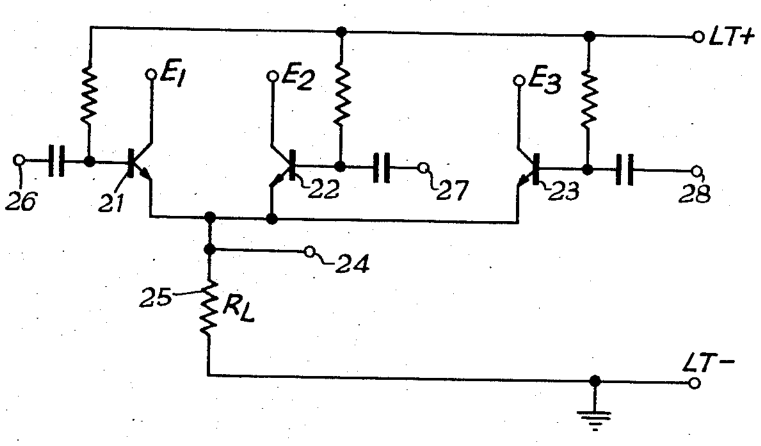

Referring now to FIG. 3, this shows a circuit arrangement comprising three NPN transistors 21, 22 and 23, the emitters of which are connected to a common output terminal 24 and through a common load resistor 25 to the earthed negative terminal LT− of a D.C. bias source (not shown). The bases of the transistor 21, 22 and 23 are coupled to input terminals 26, 27 and 28 respectively, to which in operation input signals are applied. The collectors of the transistors 21, 22 and 23 are maintained at potentials $E_1$, $E_2$ and $E_3$ respectively by connection to D.C. bias sources (not shown).

The circuit shown in FIG. 3 is employed to combine three input signals and to maintain said signals within predetermined D.C. levels. To facilitate the description of the operation of the circuit it is assumed that the potential $E_1$ is positive with respect to earth by a predetermined amount and the input signal applied to the terminal 26 is positive-going with respect to earth and is required to be D.C. restored or clamped at the potential $E_1$. Furthermore, the potential $E_2$ is positive with respect to the potential $E_1$ by a predetermined amount and the input signal applied to the terminal 27 is positive-going and is to be D.C. restored so that the resultant output signal varies only between these potential levels. The potential $E_3$ is positive with respect to $E_2$ by a predetermined amount and the input signal applied to the terminal 28 is positive-going and is required to be D.C. restored so that the resultant output signal varies only between the potential levels $E_2$ and $E_3$. It is furthermore assumed that the potential of the terminal LT+ is positive with respect to $E_3$. Finally, it is assumed that the input signals are applied in turn to the terminals 26, 27 and 28.

In operation, the input signal applied to the input terminal 26, provided it does not exceed the potential $E_1$, is transmitted to the output terminal 24, the transistor 21 acting as an emitter follower. If the input signal tends to drive the base of the transistor 21 above the potential $E_1$ the base-collector junction becomes forward biased and the input impedance drops rapidly from approximately $$\frac{R_L\left(1+j\frac{\omega}{\omega_0}\right)}{1-\alpha_0+j\frac{\omega}{\omega_0}}$$

to little more than the base resistance, which including the spreading resistance is of the order of 100–200 ohms. The base of the transistor 21 will thus maintain a potential $E_1$ despite input signal excursions above this level. The resultant output signal at the terminal 24 is thus D.C. restored to the potential level $E_1$. In like manner, the input signals subsequently applied to the input terminals 27 and 28 are D.C. restored to the potential levels $E_2$ and $E_3$ respectively.

In addition, the output signal resulting from the signal applied to the input terminal 27 is prevented from falling below the potential level $E_1$ by the action of the transistor 21. In the absence of an input signal at the terminal at the terminal 26, the base of the transistor 21 is held at the potential level $E_1$. Output signals above the potential level $E_1$ maintain the base-emitter junction of the transistor 21 reverse biased. Output signals falling below the level $E_1$ cause the base-emitter junction to become forward biased and the transistor 21 conducts and restores the potential of the output signal to the potential level $E_1$.

The output signal at the terminal 24 resulting from the signal subsequently applied to the input terminal 28 is D.C. restored by the action of the transistor 23 so as not to exceed the potential level $E_3$. In addition, this output signal is held above the potential level $E_2$ by the action of the transistor 22.

It is possible by use of a circuit such as that shown in FIG. 3 to combine several signals each within well defined D.C. levels, without the need for separate D.C. restorers.

It will be appreciated that the transistor 21 does not operate under exactly the same conditions as those assumed for the transistor 11 in FIG. 1 and the transistor 15 in FIG. 2. The base-collector junction of the transistor 11 in FIG. 1 and the transistor 15 in FIG. 2 is assumed to be reverse biased. The base-collector junction of the transistor 21 is, in the circuit of FIG. 3, forward biased. This means that the transistor 21 acts as an inverted transistor, that is to say, its collector emits and its emitter collects. The output impedance of the transistor under these conditions can be expressed as follows:

$$Z_0'=r_{c1}\frac{\left(1-\alpha_1+j\frac{\omega}{\omega_1}\right)}{1+j\frac{\omega}{\omega_1}}$$

where $\alpha_1$ is the new emitter to collector current gain
$\omega_1/2\pi$ is the current gain cut-off frequency, and
$r_{c1}$ is the inverse resistance of the base-emitter junction.

The output impedance $Z_{01}'$, although considerably lower than in the case where the base-collector junction is reverse biased, is however, still high enough to make the shunting effect of the transistor 21 upon the resistor 25 negligible.

It may sometimes be desirable to have a voltage amplifier instead of an emitter follower, whose voltage gain is just under unity.

In another embodiment of the present invention, there is provided in combination, a D.C. restorer circuit according to the said second aspect of the invention and an amplifier including a further transistor having a base electrode, a collector electrode and an emitter electrode, the base electrode of the further transistor being connected to an input circuit of the amplifier to which in operation further input signals to be amplified are applied, and the collector electrode of the further transistor being connected to said output circuit.

Figure 4:
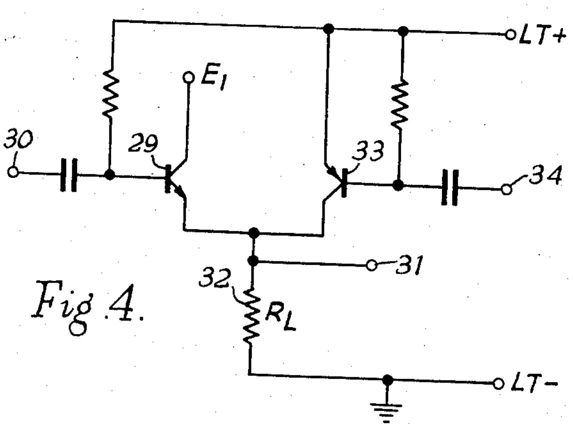

An embodiment of the invention is shown in FIG. 4. The circuit comprises an NPN transistor 29, the base of which is coupled to an input terminal 30 to which in operation signals to be D.C. restored are applied. The collector of the transistor 29 is maintained at a potential $E_1$ by a D.C. source not shown and the emitter is connected directly to an output terminal 31 and through a load resistor 32 to the earthed terminal LT— of D.C. source not shown. The circuit includes a further transistor 33 of PNP type, the base of which is coupled to an input terminal 34 to which in operation are applied signals to be amplified and mixed with the signals applied to terminal 30.

Signals applied to the terminal 30 are as hereinbefore described D.C. restored to the potential level $E_1$ by the action of the transistor 29. Signals applied to the terminal 34 are amplified by the transistor 33 and appear at the output terminal 31. When the transistor 33 is driven from its non-conducting state by signals applied to the terminal 34 no change in the potential of the output terminal occurs until the collector current of the transistor 33 has completely replaced the emitter current in the load resistor 32. After this the potential of the output terminal 31 rises and the base-emitter junction of the transistor 29 becomes reverse biased.

When the input signal to terminal 34 is such as to allow the potential of the output terminal 31 to fall below $E_1$ the latter is held at the value $E_1$ by the action of the transistor 29.

In the arrangement of FIG. 4, the transistor 29 operates as an emitter follower for signals applied to the terminal 30, when the output signal at the terminal 31 is below the potential level $E_1$, and as an inverted transistor when the output signal at the terminal 31 is above the potential level $E_1$.

According to yet another aspect of the present invention, there is provided a transistor circuit comprising a nearly symmetrical transistor having a base electrode, a collector electrode and an emitter electrode, an input circuit connected to the base electrode and to which in operation input signals are applied, an output circuit connected to the emitter electrode, and means for adjusting the D.C. potential of the emitter electrode whereby the transistor can be caused selectively to operate as an emitter follower or as a voltage amplifier on said input signals. By nearly symmetrical transistor is meant a transistor the characteristics of which are such that $$\alpha_1 \simeq \alpha_0 \text{ and } \omega_1 \simeq \omega_0$$

the terms $\alpha_1$, $\alpha_0$, $\omega_1$ and $\omega_0$ having meanings hereinbefore specified.

In an embodiment according to the last-mentioned aspect of the invention, the circuit shown in FIG. 4 is provided with means for adjusting the D.C. current flowing from the collector of the transistor 33 through the load resistor 32. If the product of the D.C. collector current of the transistor 33 and the resistance $R_L$ of the load resistor 32 is less than $E_1$ then the transistor 29 operates as an emitter follower. If the same product is greater than $E_1$ then the transistor 29 operates as a voltage amplifier.

Figure 5:
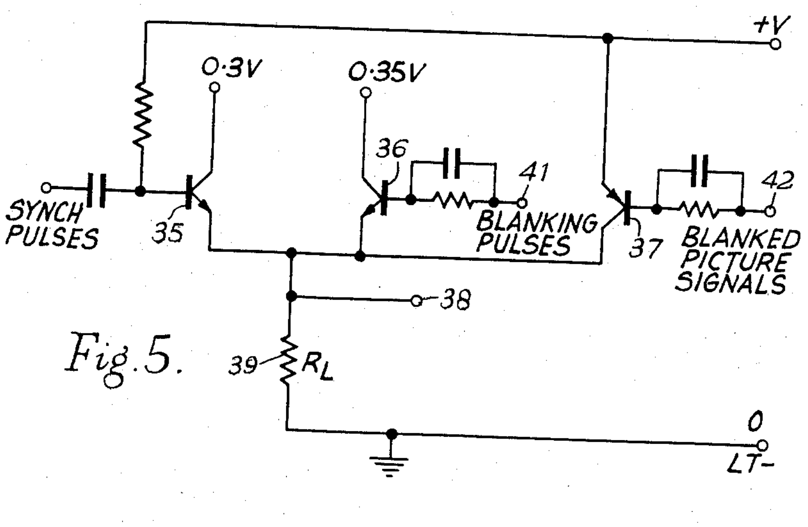

In a standard British television signal, if the peak-to-peak voltage is regarded as 100%, then 0–30% is allotted to synchronising pulses, 30 to 35% to blanking signals and 35 to 100% to picture signals. Zero percentage corresponds to the most negative and 100% to the most positive potential of the television signal. FIG. 5 shows a circuit suitable for mixing synchronising, blanking and picture signals within well-defined levels corresponding to the above specified levels.

The circuit shown in FIG. 5 comprises three transistors 35, 36 and 37, the first two being of NPN type and the last of PNP type. The emitter of the transistor 37 is maintained at a potential of V volts with respect to earth by connection to the positive terminal LT+ of a D.C. source (not shown). The negative terminal LT— of said source is earthed. The collectors of the transistors 35 and 36 are maintained at potentials equal to 0.3 v. and 0.35 v. respectively. The emitters of the transistors 35 and 36 and the collector of the transistor 37 are connected to a common output terminal 38 and through a common load resistor 39 to the earthed terminal LT—.

The base of the transistor 35 is coupled to an input terminal 40 to which in operation synchronising signals to be D.C. restored are applied. The base of the transistor 36 is coupled to an input terminal 41 to which in operation blanking signals are applied. The base of the transistor 37 is coupled to an input terminal 42 to which in operation blanked picture signals are applied.

In operation, blanked picture signals applied to the terminal 42 are amplified by the transistor 37 and appear at the output terminal 38. During these times, that is to say in the absence of synchronising and blanking pulses the base-collector junctions of the transistors 35 and 36 are forward biased. The picture signal appearing at the output terminal 38 varies in accordance with input signal applied to terminal 42, but is prevented from falling below the potential level of 0.35 v. by the action of the transistor 36. Thus, the transistor 36 sets the black level of the picture signal at 0.35 v. Blanking pulses, which occur just before and terminate just after the synchronising pulses cut-off the transistors 36 and 37. The output signal at the terminal 38 falls, but is held at the potential level of 0.3 v. by the action of the transistor 35. This level is the blanking or suppression level. With the transistors 36 and 37 cut-off, the negative-going synchronising pulse applied to the terminal 40 during the blanking period is transmitted to the output terminal 38.

The output signal at the terminal 38 is then a television signal composed of picture signals between potential levels of 0.35 v. and V, blanking signals between levels of 0.3 v. and 0.35 v., and synchronising signals between zero and 0.3 v.

It will be appreciated that in the circuits shown in FIGS. 1 to 3, the NPN transistors may be replaced by PNP transistors provided appropriate changes are also made to the supply potentials. In the circuits shown in FIGS. 4 and 5, if the NPN transistors are replaced by PNP transistors, then the PNP transistors must also be replaced by NPN transistors and appropriate changes made to the supply potentials.

I claim:

In a direct current restorer circuit the combination comprising a first transistor including emitter, base and collector electrodes; a load impedance; a source of variable voltage input signals; means coupling said emitter, base and collector electrodes of said first transistor in a common collector circuit with said load impedance coupled to said emitter electrode and said signal source coupled to said base electrode, an output terminal connected to the junction between the emitter of the first transistor and the load; a second transistor having a base, a collector, and an emitter, a source of positive constant direct current potential applied to said base, a direct current circuit connection from said collector to a direct current source, direct current circuit connections from the emitter of the second transistor to the junction of the emitter of the first transistor with said load, thereby to contribute current through said load impedance only when necessary to maintain and in an amount sufficient to maintain minimum current flow through said load impedance at said constant source potential level and to establish a potential at the output terminal substantially equal to the steady direct current potential when the variable potential at the output terminal falls to or is below the direct current potential.

References Cited in the file of this patent

UNITED STATES PATENTS

| | | |
|---|---|---|
| 2,441,880 | Goodale | May 18, 1948 |
| 2,662,938 | Goldstine | Dec. 15, 1953 |
| 2,759,142 | Hamilton | Aug. 14, 1956 |
| 2,761,917 | Aronson | Sept. 4, 1956 |
| 2,810,024 | Stanley | Oct. 15, 1957 |
| 2,816,179 | Gittleman | Dec. 10, 1957 |
| 2,859,288 | Tobias | Nov. 4, 1958 |
| 2,927,733 | Campbell | Mar. 8, 1960 |

OTHER REFERENCES

Shea: Principles of Transistor Circuits, copyright 1953, page 38, John Wiley and Sons.